United States Patent
Lim et al.

(10) Patent No.: US 8,008,172 B2
(45) Date of Patent: Aug. 30, 2011

(54) METHODS OF FORMING SEMICONDUCTOR DEVICES INCLUDING MULTISTAGE PLANARIZATION AND CRYSTALIZATION OF A SEMICONDUCTOR LAYER

(75) Inventors: Jong-Heun Lim, Seoul (KR); Chang-Ki Hong, Seongnam-si (KR); Bo-Un Yoon, Seoul (KR); Seong-Kyu Yun, Seoul (KR); Suk-Hun Choi, Suwon-si (KR); Sang-Yeob Han, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 393 days.

(21) Appl. No.: 12/070,220

(22) Filed: Feb. 15, 2008

(65) Prior Publication Data

US 2008/0200007 A1 Aug. 21, 2008

(30) Foreign Application Priority Data

Feb. 16, 2007 (KR) .................. 10-2007-0016450

(51) Int. Cl.
*H01L 21/20* (2006.01)
*H01L 21/36* (2006.01)
*H01L 21/76* (2006.01)
*H01L 21/302* (2006.01)
*H01L 21/461* (2006.01)

(52) U.S. Cl. ........ 438/487; 438/430; 438/486; 438/689; 438/690; 438/691; 438/692; 438/693

(58) Field of Classification Search .................. None
See application file for complete search history.

(56) References Cited

U.S. PATENT DOCUMENTS

| | | | |
|---|---|---|---|
| 6,265,250 B1 * | 7/2001 | Yu | 438/162 |
| 6,737,315 B2 | 5/2004 | Kuroi et al. | |
| 7,018,927 B2 | 3/2006 | Lee | |
| 2003/0054597 A1 | 3/2003 | Kuroi et al. | |
| 2004/0142582 A1 * | 7/2004 | Crowder et al. | 438/795 |
| 2005/0020075 A1 | 1/2005 | Lee | |
| 2005/0062175 A1 * | 3/2005 | Buh et al. | 257/795 |
| 2006/0014390 A1 * | 1/2006 | Lee et al. | 438/692 |
| 2006/0160325 A1 | 7/2006 | Choi | |
| 2006/0258076 A1 * | 11/2006 | Mizushima et al. | 438/201 |
| 2007/0163489 A1 | 7/2007 | Son et al. | |
| 2008/0014726 A1 * | 1/2008 | Cha et al. | 438/487 |

FOREIGN PATENT DOCUMENTS

| | | |
|---|---|---|
| JP | 2006-32846 | 2/2006 |
| KR | 20010003417 | 1/2001 |
| KR | 20030025819 | 3/2003 |
| KR | 10-2005-0011488 | 1/2005 |
| KR | 20050063045 | 6/2005 |
| KR | 10-0619394 | 8/2006 |
| KR | 100679610 B1 | 1/2007 |

* cited by examiner

*Primary Examiner* — N Drew Richards
*Assistant Examiner* — Michael Jung
(74) *Attorney, Agent, or Firm* — Mills & Onello, LLP

(57) ABSTRACT

A method of forming a semiconductor device includes: forming a pattern having trenches on a semiconductor substrate; forming a semiconductor layer on the semiconductor device that fills the trenches; planarizing the semiconductor layer using a first planarization process without exposing the pattern; performing an epitaxy growth process on the first planarized semiconductor layer to form a crystalline semiconductor layer; and planarizing the crystalline semiconductor layer until the pattern is exposed to form a crystalline semiconductor pattern.

14 Claims, 6 Drawing Sheets ly under 35 U.S.C. §119 of Korean Patent Application No.
METHODS OF FORMING SEMICONDUCTOR DEVICES INCLUDING MULTISTAGE PLANARIZATION AND CRYSTALIZATION OF A SEMICONDUCTOR LAYER

CROSS-REFERENCE TO RELATED APPLICATION

This U.S. non-provisional patent application claims priority under 35 U.S.C. §119 of Korean Patent Application No. 2007-16450, filed on Feb. 16, 2007, the entire contents of which are hereby incorporated by reference.

FIELD OF THE INVENTION

The present invention disclosed herein relates to methods of forming semiconductor devices, for example, to methods of forming semiconductor devices including a device isolation layer.

BACKGROUND

An example of a process of forming a device isolation layer is a shallow trench isolation (STI) process. The STI process includes etching a semiconductor substrate to form a trench, filling the trench with an insulating layer, and planarizing the insulating layer to fill the trench. As semiconductor devices become increasingly integrated, the aspect ratio of a trench can increase. As the aspect ratio of the trench increases, it can be difficult to fill the trench with an insulating layer. For example, in the case of flash memory devices, it can be difficult to fill the trench having a high aspect ratio only with a high density plasma (HDP) layer or an undoped silicate glass (USG) layer. To address this difficulty, a hybrid gap-fill structure having multiple layers including a spin-on glass (SOG) layer and the HDP layer has been introduced. However, the complexity of the hybrid gap-fill structure can increase cost.

In the meantime, semiconductor devices are often required to be highly integrated to meet users' demand for excellent performance at a low price. For this, a semiconductor device having a multilayer structure, for example, a flash memory device having a multilayer structure, has been introduced. The flash memory device having a multilayer structure may include a semiconductor substrate, a device isolation layer on the semiconductor substrate to define an active region, a tunnel-oxide layer on the active region, a floating gate electrode, a gate interlayer insulating layer, a control gate electrode, a top semiconductor layer, and a device isolation layer on the top semiconductor layer to define an active region. A process of forming a trench device isolation layer is performed to form a device isolation layer in the top semiconductor layer. In the process of forming a trench device isolation layer, the USG layer or the SOG layer may be used to fill a trench having a high aspect ratio. In the case of using the USG layer or the SOG layer, the process of forming a trench device isolation layer may include an annealing process at a high temperature. The annealing process at a high temperature may affect a tunnel oxide layer previously formed on the bottom portion of the top semiconductor layer. For example, the quality of the tunnel oxide layer may be degraded due to hot temperature stress (HTS). Thus, it can be difficult to apply the process of forming a trench device isolation layer to a semiconductor device having a multilayer structure. Moreover, since the process of forming a trench device isolation layer may include a number of processes, devices formed under the top semiconductor layer may be degraded.

SUMMARY OF THE INVENTION

Exemplary embodiments of the present invention provide a method of forming a semiconductor device including: forming a pattern having trenches on a semiconductor substrate; forming a semiconductor layer on the semiconductor device that fills the trenches; planarizing the semiconductor layer using a first planarization process without exposing the pattern; performing an epitaxy growth process on the first planarized semiconductor layer to form a crystalline semiconductor layer; and planarizing the crystalline semiconductor layer until the pattern is exposed to form a crystalline semiconductor pattern.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1A:
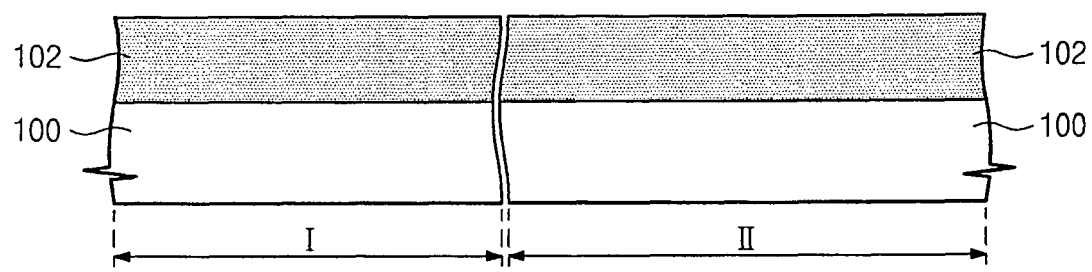
FIGS. 1a through 1f are cross-sectional views illustrating a method of forming a semiconductor device in accordance with a first embodiment of the present invention.

Embodiments of the present invention will now be described more fully with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

It will be understood that, although the terms "first", "second", "third" etc. may be used herein to describe various components, materials, etc., the components, materials, etc. should not be limited by these terms. These terms are only used to distinguish one portion from another portion. It will also be understood that when an element such as a layer, region or substrate is referred to as being "on" or "onto" another element, it may be directly on the other element or intervening elements or layers may also be present. In the drawings, the thicknesses of layers and regions are exaggerated for clarity. As used herein, the term "and/or" includes any and all combinations of one or more of the associated listed items. For example, the term "a conductive layer and/or an insulating layer" may include a conductive layer, an insulating layer, or a combination layer of a conductive layer and an insulating layer.

FIGS. 1a through 1f are cross-sectional views illustrating a method of forming a semiconductor device in accordance with a first embodiment of the present invention.

Referring to FIG. 1a, an insulating layer 102 is formed on a semiconductor substrate 100. The semiconductor substrate 100 may include a single crystalline silicon or a top semiconductor layer on the single crystalline silicon. A plurality of bottom semiconductor layers (not shown) may be between the single crystalline silicon and the top semiconductor layer. A tunnel insulating layer, a floating gate electrode, a floating interlayer insulating layer, and a control gate electrode may be formed on the bottom semiconductor layer.

The semiconductor substrate 100 may include a first region (I) and a second region (II). The first region (I) may be a cell region. The second region (II) may be a peripheral region and/or a test element group (TEG) region.

The insulating layer 102 may be a silicon oxide layer. The silicon oxide layer may include a low temperature silicon oxide (LTO) layer, a medium temperature silicon oxide (MTO) layer, or a high density plasma (HDP) silicon oxide layer. The insulating layer 102 may have a thickness of approximately 1000 angstroms to approximately 5000 angstroms.

Figure 1B:
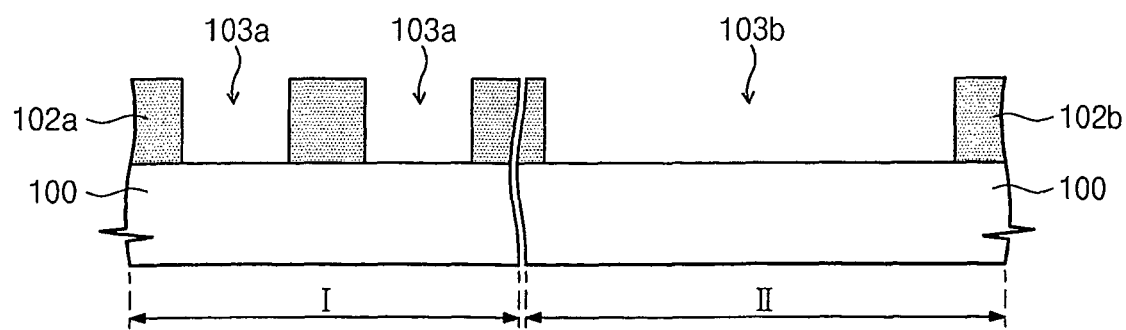

Referring to FIG. 1b, the insulating layer 102 is patterned to form insulating patterns 102a and 102b. The insulating pattern 102a includes trenches 103a exposing the semiconductor substrate 100 in the first region I and the insulating pattern 102b includes trenches 103b exposing the semiconductor substrate 100 in the second region (II). Width of trench 103b in the second region (II) may be wider than width of trench 103a in the first region I. The widths of trenches 103a, 103b may be defined as the distance between facing inside walls of the trenches. The insulating patterns 102a and 102b may be a device isolation layer for device isolation.

Figure 1C:
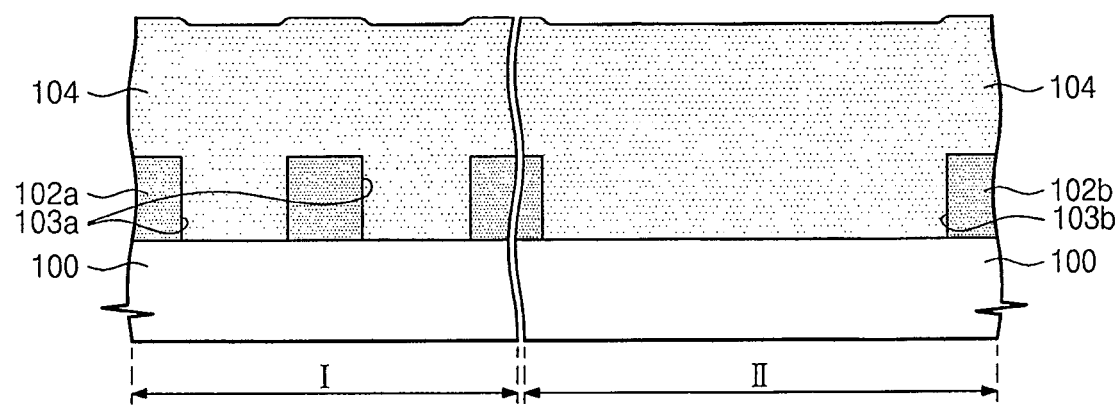

Referring to FIG. 1c, a semiconductor layer 104 is formed on the semiconductor substrate 100 to fill the trenches 103a of the first region I and the trenches 103b of the second region (II). The semiconductor layer 104 may be an amorphous silicon layer or a polysilicon layer.

Figure 1D:
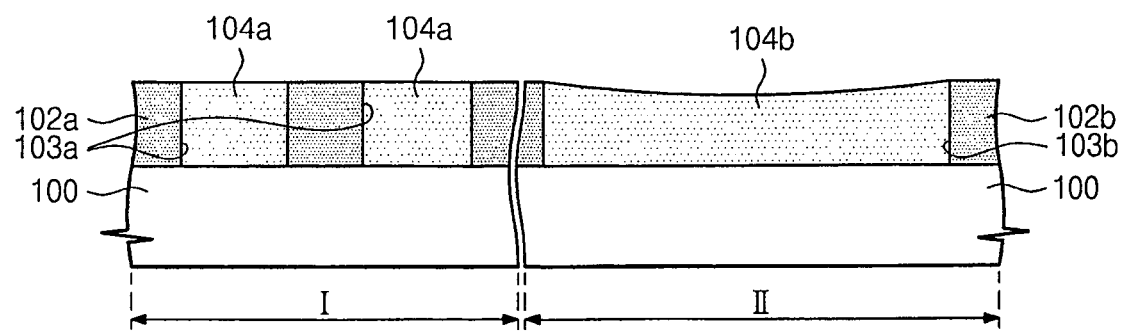

Referring to FIG. 1d, the semiconductor layer 104 is planarized until the insulating pattern 102a and 102b is exposed, to form a first planarized semiconductor layer 104a and 104b in the first region (I) and second region (II), respectively. This first planarization process may be a chemical mechanical polishing (CMP) process. Since the width of the trench 103b of the second region (II) is wide, a dishing phenomenon may occur in the first planarized semiconductor layer 104b. The thickness of the center portion of the first planarized semiconductor layer 104b of the second region (II) may be less than that of outer portions of the first planarized semiconductor layer 104b adjacent to the insulating pattern 102b of the second region (II).

Figure 1E:
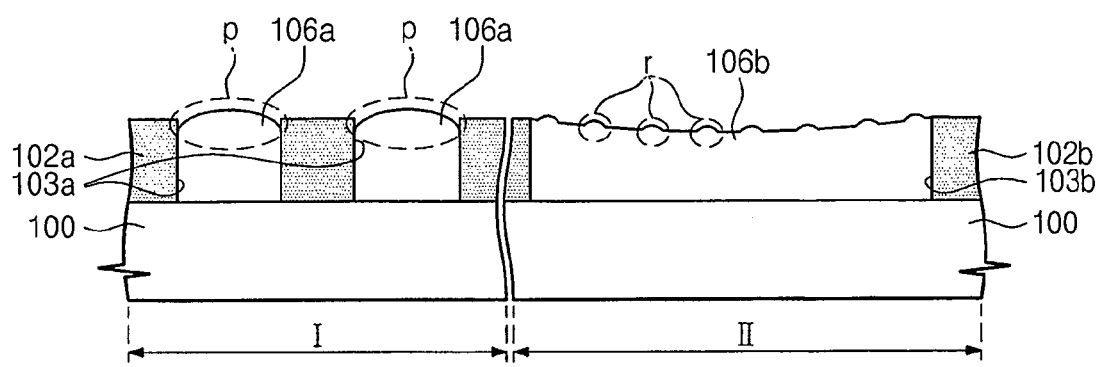

Referring to FIG. 1e, an epitaxy growth process is performed to the first planarized semiconductor layers 104a and 104b to form crystalline semiconductor layers 106a and 106b. The epitaxy growth process may be a laser epitaxy growth (LEG) process. The crystalline semiconductor layers 106a and 106b may include single crystalline silicon.

The crystalline semiconductor layers 106a and 106b may include raised portions p and r that have hemispherical shapes. The raised portions p and r having hemispherical shapes may be formed when amorphous silicon is melted by a laser beam used in the laser epitaxy growth (LEG) process and solidified to become crystalline silicon. As shown, the raised portion r in the second region (II) protrudes from the top surface of the insulating pattern 102b of the second region (II). Portions of the raised portion p in the first region (I) adjacent to the insulating pattern 102a in the first region (I) may be lower than the top surface of the insulating pattern 102a of the first region (I).

Figure 1F:
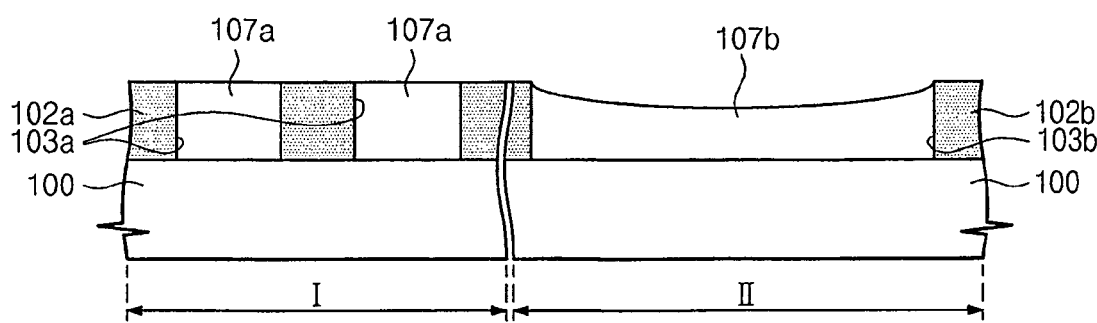

Referring to FIG. 1f, the crystalline semiconducting layers 106a and 106b are planarized to form crystalline semiconductor patterns 107a and 107b. This second planarization process may be a chemical mechanical polishing (CMP) process. The crystalline semiconductor patterns 107a and 107b may be active regions. A tunnel insulating layer, a floating gate electrode, a floating interlayer insulating layer, and a control gate electrode may be formed on the crystalline semiconductor pattern 107a in the first region (I). A high voltage transistor and/or a low voltage transistor may be formed on the crystalline semiconductor pattern 107b of the second region (II).

The crystalline semiconductor patterns 107a and 107b may have flat top surfaces since the crystalline semiconductor patterns 107a and 107b may be used as active regions. Since the raised portion p in the first region (I) adjacent to the insulating pattern 102a of the first region (I) may have formed lower than the top surface of the insulating pattern 102a in the first region (I), the raised portion p in the first region (I) and the top surface of the insulating pattern 102a of the first region (I) may be planarized simultaneously so that the crystalline semiconductor patterns 107a and 107b have flat top surfaces. As a result, the CMP process may require a long process time. The CMP process time may be over 200 seconds.

Since the width of the trench 103b in the second region (II) is wide, a dishing effect may occur on the planarized crystalline semiconductor layer 107b. Moreover, since the CMP process may require a long process time, the dishing effect may be increased. Consequently, the thickness at the center of the planarized crystalline semiconductor layer 107b of the second region (II) may be less than that of portions of the planarized crystalline semiconductor layer 107b adjacent to the insulating pattern 102b in the second region (II). The thickness of the crystalline semiconductor pattern 107b in the second region (II) may be small depending on the degree of the planarization of the top surface of the insulating pattern 102b.

According to the first embodiment of the present invention, an insulating layer for device isolation is formed unlike certain conventional device isolation processes. The problem of filling a trench having a high aspect ratio with an insulating layer and degradation of performance of the devices formed under the top semiconductor layer may be reduced (e.g., solved).

FIGS. 2a through 2f are cross-sectional views illustrating a method of forming a semiconductor device in accordance with a second embodiment of the present invention.

Figure 2A:
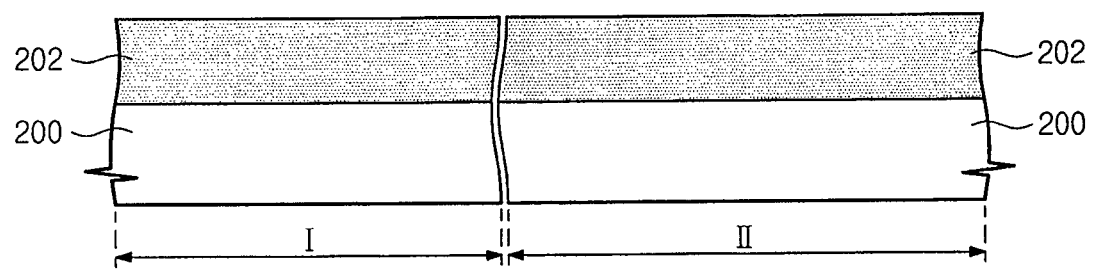
FIGS. 2a through 2f are cross-sectional views illustrating a method of forming a semiconductor device in accordance with a second embodiment of the present invention.

Referring to FIG. 2a, an insulating layer 202 is formed on a semiconductor substrate 200. The semiconductor substrate 200 may include single crystalline silicon or a top semiconductor layer on the single crystalline silicon. A plurality of bottom semiconductor layers (not shown) may be formed between the single crystalline silicon and the top semiconductor layer. A tunnel insulating layer, a floating gate electrode, a floating interlayer insulating layer, and a control gate electrode may be formed on the bottom semiconductor layers.

The semiconductor substrate 200 may include a first region (I) and a second region (II). The first region (I) may be a cell region. The second region (II) may be a peripheral region and/or a test element group (TEG).

The insulating layer 202 may be a silicon oxide layer. The silicon oxide layer may include a low temperature silicon oxide (LTD) layer, a medium temperature silicon oxide (MTO) layer, or a high density plasma (HDP) silicon oxide layer. The insulating layer 102 may have a thickness of approximately 1000 angstroms to approximately 5000 angstroms.

Figure 2B:
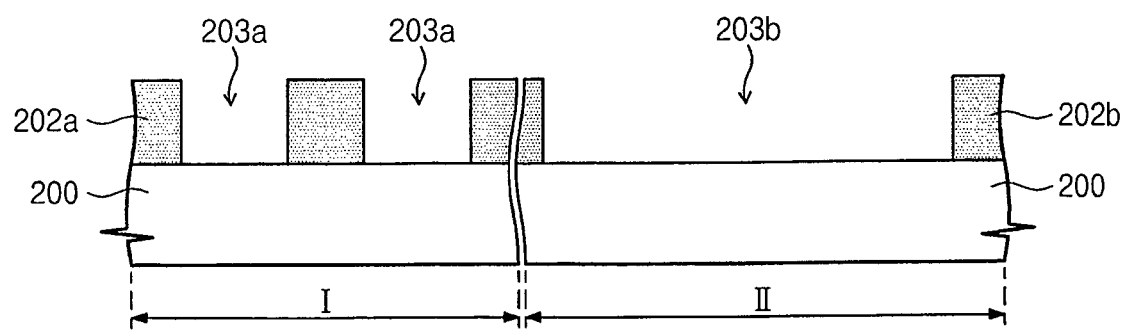

Referring to FIG. 2b, the insulating layer 202 is patterned to form insulating patterns 202a and 202b. The insulating pattern 202a includes trenches 203a that expose the semiconductor substrate 200 in the first region I, and the insulating pattern 202b includes trenches 203b that expose the semiconductor substrate 200 in the second region (II). The width of trench 203b in the second region (II) may be wider than the width of trench 203a in the first region I. The widths of the trenches may be defined as the distance between facing inside walls of the trenches. The insulating patterns 202a and 202b may be a device isolation layer for device isolation.

In some embodiments, an etch stop layer (not shown) may be formed on the semiconductor substrate 200 before the insulating pattern 202a and 202b is formed. The etch stop layer may be a silicon nitride layer. When the etch stop layer is a silicon nitride layer, a buffer layer (not shown) may be formed between the semiconductor substrate 200 and the etch stop layer. The buffer layer may be a silicon oxide layer. After the insulating layer 202a is formed, a liner layer (not shown) layer may be conformally formed on the trenches 203a of the first region (I). The liner layer may be a silicon nitride layer. The liner layer can be anisotropically etched to form a liner pattern on a sidewall of the trench 203a in the first region (I).

Figure 2C:
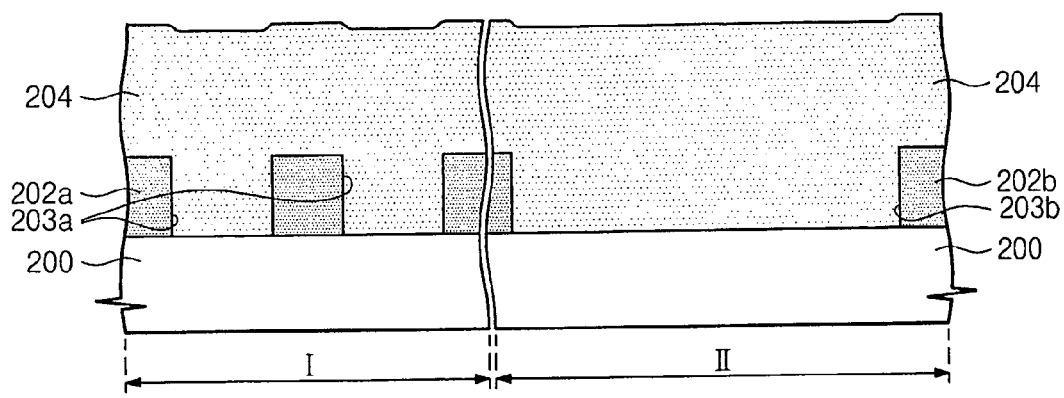

Referring to FIG. 2c, a semiconductor layer 204 is formed to fill the trenches 203a in the first region I and the trenches 203b in the second region (II). The semiconductor layer 204 may be an amorphous silicon layer or a polysilicon layer.

Figure 2D:
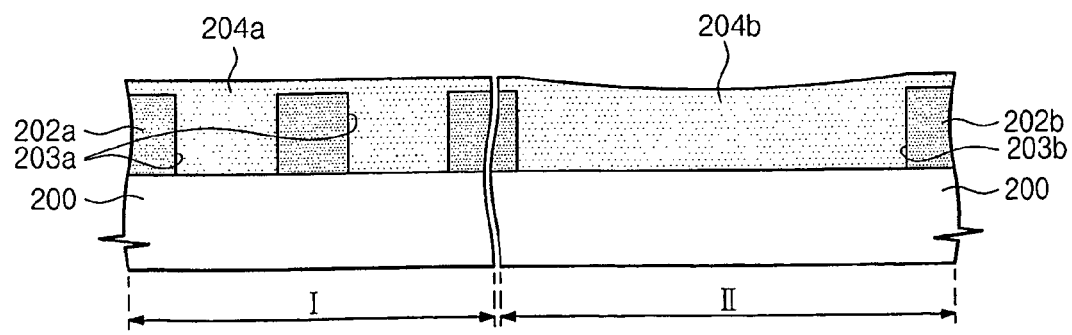

Referring to FIG. 2d, the semiconductor layer 204 is planarized, but without exposing the insulating pattern 202a. This first planarization process may be a chemical mechanical polishing (CMP) process. The distance between a top surface of the first planarized semiconductor layer 204a and the insulating layer 202a can be several hundreds of angstroms, for example, approximately 500 angstroms.

Since the width of the trenches 203b in the second region (II) can be wider than that of the trenches 203a in the second region (I), a dishing effect may occur on the first planarized semiconductor layer 204b. But since the top surface of the first planarized semiconductor layers 204a and 204b is higher than the insulating patterns 202a and 202b, unlike the first embodiment of the present invention, the dishing effect caused by the first planarization process may affect any dishing effect caused by a subsequent second planarization process less.

Figure 2E:
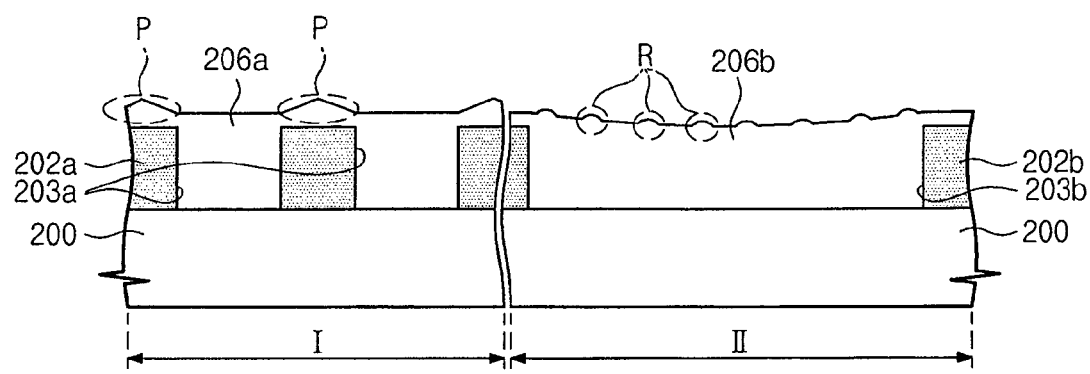

Referring to FIG. 2e, an epitaxy growth process is performed on the first planarized semiconductor layers 204a and 204b to form a crystalline semiconductor layer 206a and 206b. The epitaxy growth process may be a laser epitaxy growth (LEG) process. The crystalline semiconductor layer 206a and 206b may include single crystalline silicon. The crystalline semiconductor layer 206a and 206b may have an etching selectivity with respect to the insulating pattern 202a and 202b.

The crystalline semiconductor layer 206a and 206b may include raised portions P and R. The raised portions P and R may be formed when amorphous silicon is melted by a laser beam used in the laser epitaxy growth (LEG) process and solidified to become crystalline silicon. The crystalline semiconductor layer 206a of the first region (I) may include raised portions having triangular shapes on the insulating pattern 202a. The crystalline semiconductor layer 206b of the second region (II) may include raised portions having hemispherical shapes on the insulating pattern 202b.

Figure 2F:
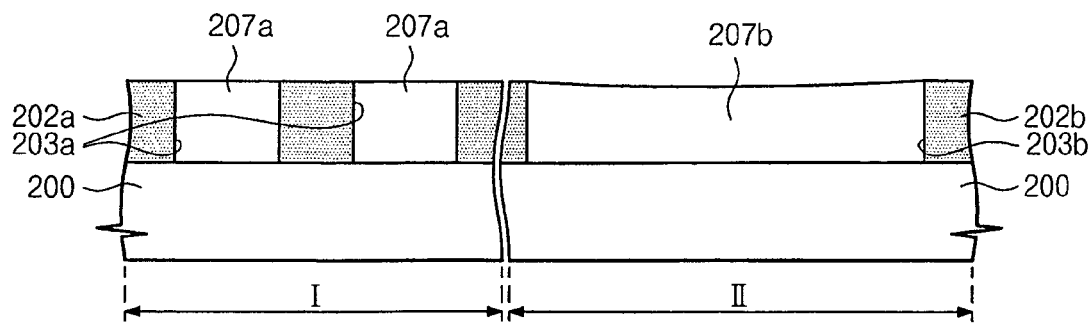

Referring to FIG. 2f, the crystalline semiconductor layer 206a and 206b is planarized until the insulating pattern 202a and 202b is exposed to form a crystalline semiconductor pattern 207a and 207b. This second planarization process may be a chemical mechanical polishing (CMP) process. The CMP process time may be approximately 40 seconds. The second planarization process may include a slurry having silica. The solid powder concentration and acidity of the slurry can be approximately 0.01-20 wt % and approximately 8 to approximately 12, respectively. The slurry may further include an organic compound material, such as an amine. The crystalline semiconductor pattern 207a and 207b may be an active region. A tunnel insulating layer, a floating gate electrode, a floating interlayer insulating layer, and a control gate electrode may be formed on the crystalline semiconductor pattern 207a of the first region (I). A high voltage transistor and/or a low voltage transistor may be formed on the crystalline semiconductor pattern 207b of the second region (II).

In some embodiments, a dishing effect may occur on the crystalline semiconductor pattern 207b of the second region (II), for example, due to the second planarization process. Unlike the first embodiment of the present invention, the crystalline semiconductor layers 206a and 206b may have the top surface higher than that of the insulating patterns 202a and 202b. As a result, the insulating pattern 202a is not required to be additionally planarized so that the crystalline semiconductor pattern 207a has a flat top surface. A second planarization process time may be reduced. The dishing effect in the crystalline semiconductor pattern 207b of the second region (II) caused by the second planarization process may be reduced. Also, since the crystalline semiconductor layers 206a and 206b may be planarized down to only the top surface of the insulating patterns 202a and 202b, an appropriate thickness for the device isolation and/or the active region may be maintained. Consequently, the crystalline semiconductor patterns 207a and 207b may have a flat top surface and maintain an appropriate thickness.

What is claimed is:

1. A method of forming a semiconductor device, comprising:
    forming a pattern on a semiconductor substrate, the pattern having a top surface and trenches exposing the semiconductor substrate;
    forming an amorphous semiconductor layer that fills the trenches and covers all of the top surface of the pattern;
    planarizing the amorphous semiconductor layer without exposing the pattern to form a planarized amorphous semiconductor layer that covers all of the top surface of the pattern;
    crystallizing the planarized amorphous semiconductor layer to form a crystalline semiconductor layer having a raised portion disposed on the top surface of the pattern; and
    planarizing the crystalline semiconductor layer until the pattern is exposed to form a crystalline semiconductor pattern.

2. The method of claim 1, wherein the epitaxy growth process is a laser epitaxy growth (LEG) process.

3. The method of claim 1, wherein the semiconductor substrate includes a first region and a second region, and
    a width between inside walls of a trench in the second region is wider than a width between inside walls of a trench in the first region.

4. The method of claim 3, wherein the first region is a cell region and the second region is a peripheral region.

5. The method of claim 4, wherein the cell region includes a crystalline semiconductor layer having a raised portion of triangular shape.

6. The method of claim 1, wherein the crystalline semiconductor pattern is an active region.

7. The method of claim 1, wherein the pattern is an insulating pattern for device isolation.

8. The method of claim 7, wherein the crystalline semiconductor layer has an etching selectivity with respect to the insulating pattern.

9. The method of claim 8, wherein the crystalline semiconductor layer and the insulating pattern include single crystalline silicon and a silicon oxide layer, respectively.

10. The method of claim 1, wherein planarizing the crystalline semiconductor layer includes a chemical mechanical polishing (CMP) process.

11. The method of claim 10, wherein the chemical mechanical polishing (CMP) process includes using a slurry having silica,
   wherein the slurry has a solid powder concentration of approximately 0.01-20 wt % and an acidity (pH) of approximately 8 to approximately 12.

12. The method of claim 11, wherein the slurry further comprises an organic amine material.

13. The method of claim 1, wherein planarizing the semiconductor layer includes a chemical mechanical polishing (CMP) process.

14. The method of claim 1, wherein forming the crystalline semiconductor layer comprises performing an epitaxy growth process on the planarized amorphous semiconductor layer.

* * * * *